US012764964B2

(12) United States Patent
Nam et al.

(10) Patent No.: US 12,764,964 B2
(45) Date of Patent: Oct. 13, 2026

(54) THREE-DIMENSIONAL FERROELECTRIC MEMORY DEVICE

(71) Applicant: Samsung Electronics Co., Ltd., Suwon-si (KR)

(72) Inventors: Seunggeol Nam, Suwon-si (KR); Jinseong Heo, Suwon-si (KR); Hyunjae Lee, Suwon-si (KR); Dukhyun Choe, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 318 days.

(21) Appl. No.: 18/491,161

(22) Filed: Oct. 20, 2023

(65) Prior Publication Data

US 2024/0172447 A1 May 23, 2024

(30) Foreign Application Priority Data

Nov. 21, 2022 (KR) ........................ 10-2022-0156765

(51) Int. Cl.

| | |
|---|---|
| ***H10B 51/10*** | (2023.01) |
| ***H10B 51/20*** | (2023.01) |
| ***H10D 30/69*** | (2025.01) |
| ***H10D 64/01*** | (2025.01) |
| ***H10D 64/68*** | (2025.01) |

(52) U.S. Cl.

CPC ............. *H10B 51/20* (2023.02); *H10B 51/10* (2023.02); *H10D 30/701* (2025.01); *H10D 64/033* (2025.01); *H10D 64/689* (2025.01)

(58) Field of Classification Search

CPC ........ H10B 51/20; H10B 51/10; H10B 51/30; H10D 30/701; H10D 64/033; H10D 64/689; H10D 64/035

See application file for complete search history.

(56) References Cited

U.S. PATENT DOCUMENTS

| | | | |
|---|---|---|---|
| 10,453,861 | B1 | 10/2019 | Dong et al. |
| 2020/0020704 | A1 | 1/2020 | Dong et al. |
| 2021/0082957 | A1 | 3/2021 | Sakuma et al. |

(Continued)

FOREIGN PATENT DOCUMENTS

| | | | |
|---|---|---|---|
| WO | 2022/239957 | A1 | 11/2022 |

OTHER PUBLICATIONS

Jae-Gil Lee et al.,"Memory Window Expansion for Ferroelectric FET based Multilevel NVM: Hybrid Solution with Combination of Polarization and Injected Charges," 2022 IEEE International Memory Workshop (IMW), May 15, 2022.

(Continued)

*Primary Examiner* — Elias Ullah

(74) *Attorney, Agent, or Firm* — Harness, Dickey & Pierce, P.L.C.

(57) ABSTRACT

Provided is a three-dimensional (3D) ferroelectric memory device. The 3D ferroelectric memory device includes a substrate, a plurality of insulating layers stacked on the substrate, a plurality of gate electrodes between the plurality of insulating layers, a plurality of gate insulating layers in contact with the plurality of gate electrodes, a plurality of intermediate electrodes in contact with the plurality of gate insulating layers, a ferroelectric layer in contact with the plurality of intermediate electrodes and the plurality of insulating layers, and a channel layer in contact with the ferroelectric layer.

20 Claims, 19 Drawing Sheets

(56) References Cited

U.S. PATENT DOCUMENTS

| | | | | |
|---|---|---|---|---|
| 2021/0175253 | A1 | 6/2021 | Han et al. | |
| 2021/0358952 | A1* | 11/2021 | Makala | H10B 51/00 |
| 2022/0005830 | A1 | 1/2022 | Wu et al. | |

OTHER PUBLICATIONS

Extended European Search Report issued Apr. 25, 2024 in European Application No. 23209392.2.

* cited by examiner

THREE-DIMENSIONAL FERROELECTRIC MEMORY DEVICE

CROSS-REFERENCE TO RELATED APPLICATION

This application is based on and claims priority under 35 U.S.C. § 119 to Korean Patent Application No. 10-2022-0156765, filed on Nov. 21, 2022, in the Korean Intellectual Property Office, the disclosure of which is incorporated by reference herein in its entirety.

BACKGROUND

1. Field

The disclosure relates to a three-dimensional (3D) ferroelectric memory device.

2. Description of the Related Art

Demand for reliable solid-state drives (SSDs) has increased as hard disks have been replaced with solid-state drives (SSDs), and thus, demand for NAND flash memory devices, which are nonvolatile memory devices, has also increased. Recently, due to the requirements for highly integrated memory devices of compact sizes, a three-dimensional (3D) NAND flash memory device having a plurality of memory cells stacked on a substrate in a perpendicular direction has been developed.

In addition, research is currently in progress into the application of a ferroelectric field-effect transistor (FeFET), which has advantages such as a low operating voltage and a high programming rate, to 3D NAND flash memory devices.

SUMMARY

Provided are three-dimensional (3D) ferroelectric memory devices.

Additional aspects will be set forth in part in the description which follows and, in part, will be apparent from the description, or may be learned by practice of the presented embodiments of the disclosure.

According to an aspect of the disclosure, a 3D ferroelectric memory device includes a substrate; a plurality of insulating layers stacked on an upper surface of the substrate; a plurality of gate electrodes between the plurality of insulating layers; a plurality of gate insulating layers in contact with corresponding side surfaces of the plurality of gate electrodes; a ferroelectric layer in contact with side surfaces of the plurality of insulating layers; a plurality of intermediate electrodes between the plurality of gate insulating layers and the ferroelectric layers; and a channel layer in contact with the ferroelectric layer.

Each of the plurality of intermediate electrodes may be configured to include a charge of a first polarity.

The plurality of gate electrodes, when viewed in a cross-sectional view, may be stacked in a direction perpendicular to the upper surface of the substrate, and each of the plurality of gate electrodes may extend in a direction parallel to the upper surface of the substrate.

Each of the plurality of gate electrodes may be electrically connected to a word line, and each of the plurality of intermediate electrodes may be configured to be a floating electrode.

The plurality of intermediate electrodes may extend to protrude from side surfaces of the plurality of insulating layers in a first direction parallel to the upper surface of the substrate.

The ferroelectric layer and the channel layer may each have a protruding shape corresponding to a protruding portion of the plurality of intermediate electrodes.

The plurality of gate insulating layers may be respectively provided on an upper, a lower surface, and a side surface of the plurality of gate electrodes, the upper and lower surfaces of the corresponding gate electrodes parallel to the upper surface of the substrate, and the side surface of the corresponding gate electrodes perpendicular to upper surface the substrate.

The plurality of gate insulating layers may be respectively on one side surface of corresponding gate electrodes of the plurality of gate electrodes.

A source electrode and a drain electrode may be respectively on both sides of the channel layer in a second direction that is parallel to the substrate and perpendicular to the first direction.

The source electrode may be electrically connected to a corresponding source line, and the drain electrode may be electrically connected to a corresponding bit line.

The plurality of intermediate electrodes may, in a cross-sectional view, extend towards side surfaces of the plurality of insulating layers in a first direction parallel to the upper surface the substrate.

The plurality of gate insulating layers may be respectively on an upper surface, a lower surface, and the side surface of corresponding gate electrodes of the plurality of gate electrodes, the upper and lower surfaces of the corresponding gate electrodes parallel to the upper surface of the substrate, and the side surface of the corresponding gate electrodes being perpendicular to the upper surface of the substrate.

The plurality of gate insulating layers may be respectively on the side surface of the corresponding gate electrode.

Each of the plurality of gate electrodes and each i of the plurality of intermediate electrodes may independently include at least one of W, TiN, TaN, WN, NbN, Mo, Ru, Ir, RuO, IrO, or polysilicon.

The insulating layers may include at least one of SiO, SiOC, or SiON.

The ferroelectric layers may include a ferroelectric fluorite-based material, a ferroelectric nitride-based material, or a ferroelectric perovskite.

The gate insulating layers may include at least one of SiO, SiN, AlO, HfO, or ZrO.

The channel layer may extend in a direction perpendicular to the upper surface of the substrate.

The channel layer may be provided to correspond with the plurality of gate electrodes.

The channel layer may include at least one of a Group IV semiconductor, a Group III-V semiconductor, an oxide semiconductor, a nitride semiconductor, a nitrogen oxide semiconductor, a two-dimensional (2D) semiconductor material, quantum dots, or an organic semiconductor.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
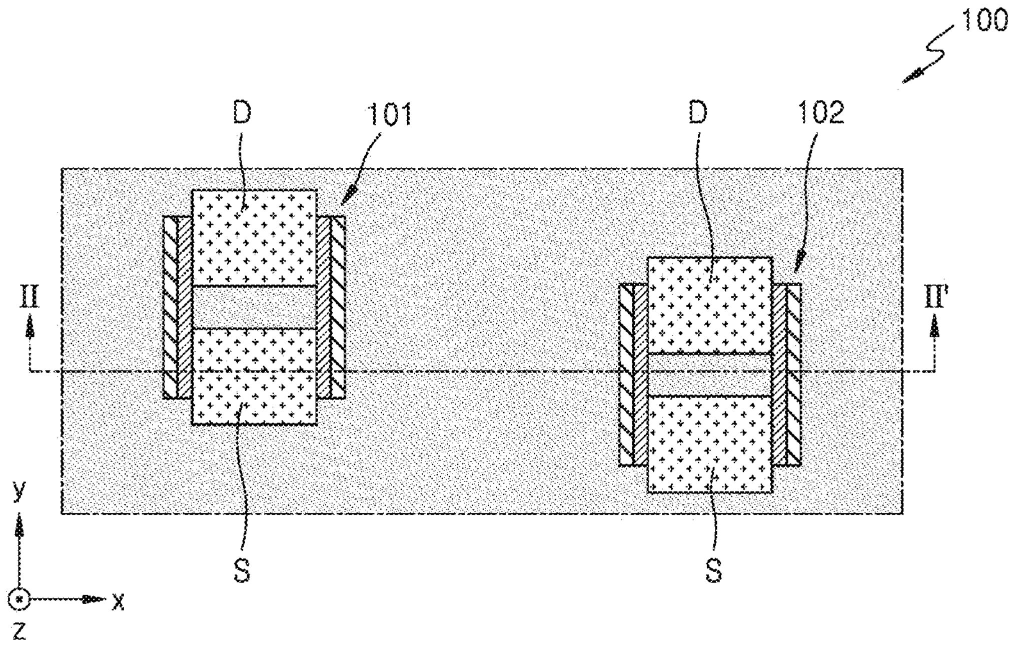
FIG. 1 is a plan view of a three-dimensional (3D) ferroelectric memory device according to at least one embodiment.

Reference will now be made in detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. In the drawings, sizes of constituent elements may be exaggerated for convenience of explanation and the clarity of the specification. In this regard, embodiments described herein may have different forms and should not be construed as being limited to the descriptions set forth herein.

It will also be understood that when an element is referred to as being "on" or "above" another element, the element may be in direct contact with the other element or other intervening elements may be present. In addition, it will be understood that these, and other similar, directional terms are intended to encompass different orientations in addition to the orientation depicted in the figures. For example, if the device in the figures is otherwise oriented (e.g., rotated 90 degrees or at other orientations), the directional descriptors used herein are to be interpreted accordingly. The singular forms include the plural forms unless the context clearly indicates otherwise. It should be understood that, when a part "comprises" or "includes" an element, unless otherwise defined, other elements are not excluded from the part and the part may further include other elements.

The use of the terms "a" and "an" and "the" and similar referents are to be construed to cover both the singular and the plural. The steps of all methods described herein can be performed in any suitable order unless otherwise indicated herein or otherwise clearly contradicted by context, and are not limited to the described order. Although the terms "first," "second." etc., may be used herein to describe various elements, these elements should not be limited by these terms. These terms are only used to distinguish one element from another.

Also, in the specification, the term " . . . units" or " . . . modules" denote units or modules that process at least one function or operation, and may be realized by processing circuitry such as hardware, software, or a combination of hardware and software. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc., and/or electronic circuits including said components. The processing circuitry may include electrical components such as logic gates including at least one of AND gates, OR gates, NAND gates, NOT gates, etc., and/or electronic circuits including said components.

Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of any and all examples, or exemplary language (e.g., "such as") provided herein, is intended merely to better illuminate the disclosure and does not pose a limitation on the scope of the disclosure unless otherwise claimed. When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., +10%) around the stated numerical values.

Figure 2:
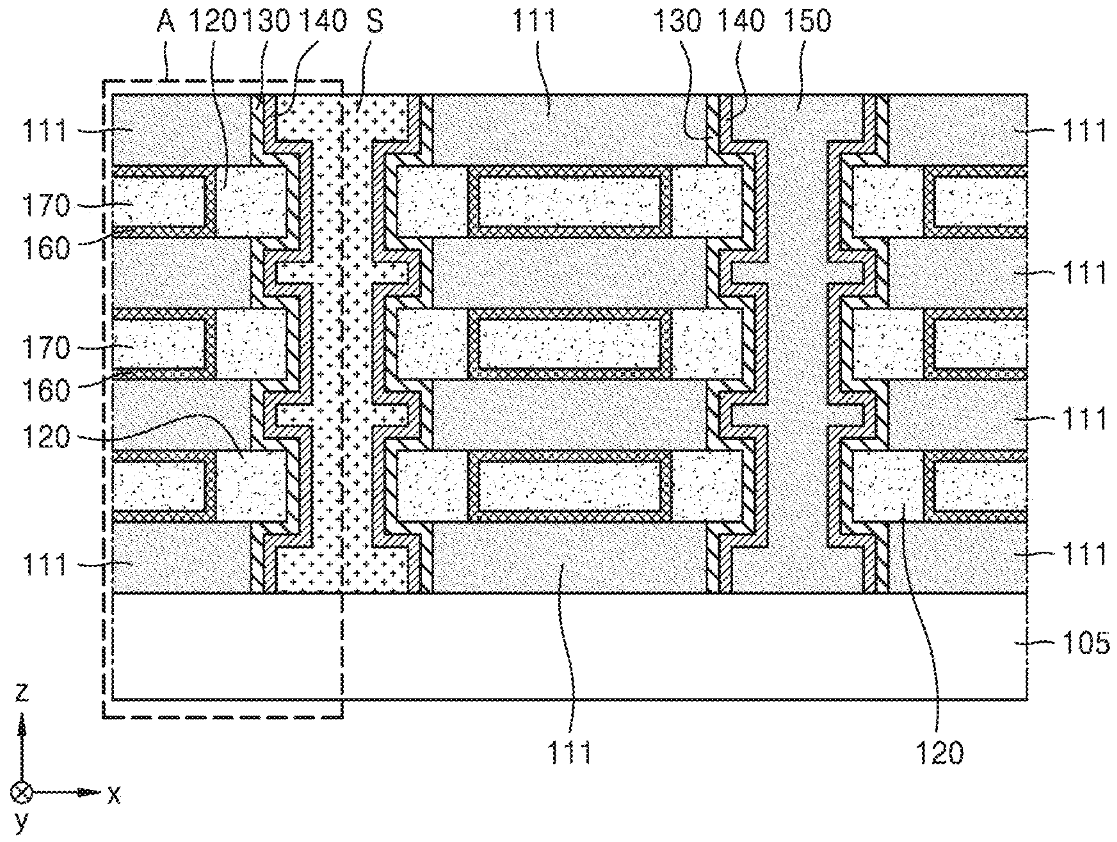
FIG. 2 is a cross-sectional view taken along line II-II' of FIG. 1.
Figure 3:
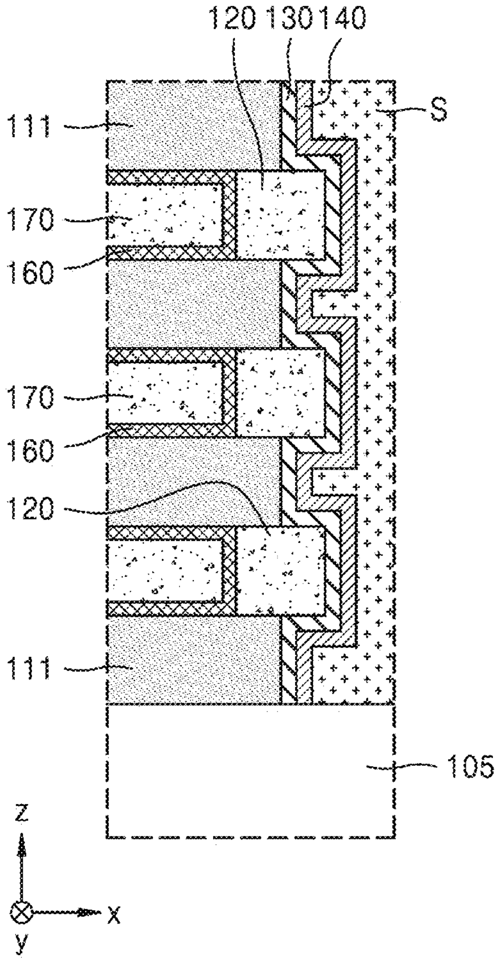
FIG. 3 illustrates portion A of the 3D ferroelectric memory device illustrated in FIGS. 1 and 2, according to at least one embodiment.
Figure 4:
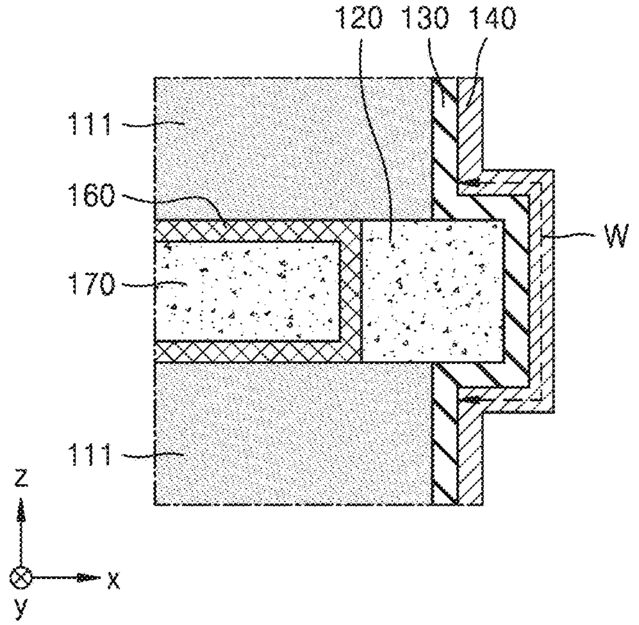
FIG. 4 is an enlarged cross-sectional view of one ferroelectric field-effect transistor in the 3D ferroelectric memory device illustrated in FIG. 3.

FIG. 1 is a plan view of a three-dimensional (3D) ferroelectric memory device according to at least one embodiment. FIG. 2 is a cross-sectional view taken along line II-II' of FIG. 1. FIG. 3 illustrates portion A of the 3D ferroelectric memory device 100 illustrated in FIGS. 1 and 2, according to at least one embodiment. FIG. 4 is an enlarged cross-sectional view of one FeFET.

Referring to FIGS. 1 and 2, a 3D ferroelectric memory device 100 includes a plurality of vertical stack structures 101 and 102 arranged apart from each other on a substrate 105. While two vertical stack structures 101 and 102 are illustrated in FIG. 1 as an example, the 3D ferroelectric memory device 100 may further include various numbers of vertical stack structures. Additionally, while the two vertical stack structures 101 and 102 are illustrated in FIG. 1 as being not aligned in the y-direction, the examples are not limited thereto, and the 3D ferroelectric memory device 100 may include a plurality of vertical stack structures arranged in a grid and/or array.

Each vertical stack structure 101 and 102 may include a plurality of memory cells stacked vertically (e.g., in the z-axis direction) with respect to the substrate 105, and each memory cell may include a ferroelectric field effect transistor (FeFET) having a metal insulator metal ferroelectric semiconductor (MIMFS) structure, as will be described later. The z-axis direction may also be referred to as a perpendicular direction with respect to the substrate 105.

The substrate 105 may include various materials. For example, the substrate 105 may include a single-crystal silicon substrate, a compound semiconductor substrate, and/or a silicon on insulator (SOI) substrate. However, these are merely examples, and the substrate 105 including other various materials may be used. In addition, the substrate 105 may further include an impurity region formed by doping, an electronic element such as a transistor, and/or a periphery circuit for selecting and controlling memory cells for storing data.

A plurality of FeFETs are stacked in a direction perpendicular to a surface of the substrate 105 (z-axis direction). Each FeFET may have an MIMFS structure. For example, each FeFET includes a gate electrode 170, a gate insulating layer 160, an intermediate electrode 120, a ferroelectric layer 130, and a channel layer 140 sequentially provided in a first direction parallel to the surface of the substrate 105 (e.g., x-axis direction). A word line (not shown) is electrically connected to each gate electrode 170 such that a voltage may be applied to each of the gate electrodes 170 through a corresponding word line.

The channel layer 140 may extend in the direction perpendicular to the surface of the substrate 105 (e.g., the z-axis direction). The channel layer 140 may be provided in common to and corresponding to the plurality of FeFETs. A source electrode S and a drain electrode D are arranged apart from each other on both sides of the channel layer 140 in a second direction which is parallel to the surface of the substrate 105 (e.g., the y-axis direction) and perpendicular to the first direction (x-axis direction). A filling insulating layer 150 may be filled between the source electrode S and the drain electrode D.

Each source electrode S may be electrically connected to a source line (not shown), and each drain electrode D may be electrically connected to a bit line (not shown). The channel layer 140 between the source electrode S and the drain electrode D may form a channel of each FeFET. The channel of each FeFET may be referred to as extending between the source electrode S and the drain electrode D and/or in parallel to the surface of the substrate 105.

Referring to FIGS. 3 and 4, a plurality of insulating layers 111 are stacked in the direction perpendicular to the substrate 105 (e.g., z-axis direction), and between the plurality of insulating layers 111, a plurality of gate electrode 170 are stacked. The plurality of gate electrodes 170 may be stacked in the direction perpendicular to the substrate 105 (e.g., z-axis direction), and each gate electrode 170 may extend in a direction parallel to the substrate 105. Here, each gate electrode 170 may be recessed with respect to side surfaces of adjacent insulating layers 111 in a direction parallel to the substrate 105.

The insulating layers 111 are for insulation between the gate electrodes 170, and may include, for example, an electrically insulating material (hereafter an "insulating material) such at least one of SiO, SiOC, and/or SiON. However, the disclosure is not limited thereto. In at least some embodiments, the insulating layers 111 may have a thickness of about 7 nm to about 100 nm, but this is only an example, and the disclosure is not limited thereto.

The gate electrode 170 may include a conductive material. For example, the conductive material may be (and/or include) a metal, metal nitride, metal oxide, polysilicon, and/or the like. For example, the gate electrode 170 may include at least one of W, TiN, TaN, WN, NbN, Mo, Ru, Ir, RuO, IrO, highly doped polysilicon, and/or the like. However, this is only an example, and the gate electrode 170 may include other various conductive materials. A thickness of the gate electrode 170 may be approximately about 5 nm to about 100 nm, but is not limited thereto.

Each gate electrode 170 is provided with a gate insulating layer 160. The gate insulating layer 160 may be provided to be in contact with the gate electrode 170. For example, the gate insulating layer 160 may be provided on upper and lower surfaces of the gate electrode 170 parallel to the substrate 105 and on at least one side surface of the gate electrode 170 perpendicular to the substrate 105. For example, the gate insulating layer 160 may be provided to extend from one side surface of the gate electrode 170 to cover the upper and lower surfaces of the gate electrode 170. Upper and lower surfaces of the gate insulating layer 160 may be in contact with the insulating layer 111. According to at least some embodiments, the gate insulating layer 160 may include an insulating material, such as at least one of SiO, SiN, AlO, HfO, and ZrO, but is not limited thereto.

Each gate insulating layer 160 is provided with (and/or adjacent to) the intermediate electrode 120, which may be referred to as a floating electrode. The intermediate electrode 120 may be provided to be in contact with the one side surface of the gate insulating layer 160. As charges of a certain polarity are applied to the intermediate electrode 120, as will be described later, a memory window (MW) of a FeFET may be increased.

The intermediate electrode 120 may include a conductive material, like the gate electrode 170. For example, the intermediate electrode 120 may include at least one of W, TiN, TaN, WN, NbN, Mo, Ru, Ir, RuO, IrO, polysilicon, and/or the like. The intermediate electrode 120 may include a same conductive material as the gate electrode 170, or may include a conductive material different from that of the gate electrode 170.

Each of the intermediate electrodes 120 may be provided to protrude from side surfaces of adjacent insulating layers 111 in the first direction parallel to the surface of the substrate 105 (e.g., the x-axis direction). The thickness of the intermediate electrode 120, in the cross-sectional view, may be a distance between adjacent insulating layers 111. Additionally, when a thickness of the gate electrode 170 is "t1" and a thickness of the gate insulating layer 160 is "t2", a thickness of the intermediate electrode 120 may be $t1+2\cdot t2$.

The ferroelectric layer 130 may be provided to contact the side surfaces of the insulating layers 111 and the protruding surfaces of and the intermediate electrodes 120. The ferroelectric layer 130 may extend in the direction perpendicular to the surface of the substrate 105 (e.g., the z-axis direction). The ferroelectric layer 130 may have a curved shape contouring to the intermediate electrodes 120 protruding from the side surfaces of the insulating layers 111 in the first direction parallel to the surface of the substrate 105 (e.g., the x-axis direction).

A ferroelectric has a spontaneous dipole (electric dipole), that is, spontaneous polarization, because a charge distribution in unit cells therein are non-centrosymmetric in a crystallized material structure. As such, after the spontaneous dipole is established the ferroelectric has a remnant polarization due to a dipole even in the absence of an external electric field. In a ferroelectric, a direction of polarization may be switched in units of domains by an external electric field.

The ferroelectric layer 130 may include, for example, a ferroelectric fluorite-based material, a ferroelectric nitride-based material, a ferroelectric perovskite, and/or the like. The nitride-based material may include, for example, AlScN, and the perovskite may include, for example, lead zirconate titanate (PZT), $BaTiO_3$, $PbTiO_3$, and/or the like. However, the disclosure is not limited thereto.

The fluorite-based material may include an oxide of at least one of, for example, Hf, Si, Al, Zr, Y, La, Gd, and Sr. As an example, the ferroelectric layer 130 may include at least one of hafnium oxide (HfO), zirconium oxide (ZrO), and/or hafnium-zirconium oxide (HfZrO). For example, the hafnium oxide (HfO), zirconium oxide (ZrO), and/or hafnium-zirconium oxide (HfZrO) constituting the ferroelectric layer 130 would have crystal structure of an orthorhombic crystal system. The ferroelectric layer 130 may further include, for example, at least one dopant from among Si, Al, La, Y. Sr, and Gd. According to at least some embodiments, the dopant may stabilize the orthorhombic phase and/or may improve the spontaneous polarization, dielectric constant, and/or the like.

The channel layer 140 may be provided to be in contact with the ferroelectric layer 130. The ferroelectric layer 130 and the channel layer 140 may be sequentially stacked in the first direction parallel to the surface of the substrate 105 (e.g., the x-axis direction). The channel layer 140 may have a curved shape corresponding to the ferroelectric layer 130. For example, the channel layer 140 may have a three-dimensional shape corresponding to the protruding shape of the intermediate electrode 120 such that a width W of a channel formed between the source electrode S and the drain electrode D may be increased, thereby increasing an on-current.

The channel layer 140 may be provided in a direction perpendicular to the substrate 105 to correspond to the plurality of gate electrodes 170. Accordingly, a plurality of FeFETs vertically stacked on the substrate 105 may share one channel layer 140.

The channel layer 140 may include a semiconductor material. For example, the channel layer 140 may include, a Group IV semiconductor and/or a Group III-V semiconductor (such as Si, Ge, SiGe, and/or the like). According to some embodiments, the channel layer 140 may include, for example, an oxide semiconductor, a nitride semiconductor, a nitrogen oxide semiconductor, a 2D semiconductor material, quantum dots, an organic semiconductor, and/or the like. Here, the oxide semiconductor may include, for example, InGaZnO and/or the like, and the 2D semiconductor material may include, for example, transition metal dichalcogenide (TMD), graphene, and/or the like, and the quantum dots may include colloidal QDs, a nanocrystal structure, and/or the like. However, this is merely an example, and the present embodiment is not limited thereto.

The channel layer 140 may further include a dopant. Here, the dopant may include a p-type dopant or an n-type dopant. The p-type dopant may include, for example, a Group III element such as B, Al, Ga, In, and/or the like, and the n-type dopant may include, for example, a Group V element such as P, As, Sb, and/or the like. The channel layer 140 may have a thickness of about 1 nm to about 20 nm, but is not limited thereto.

Referring to FIGS. 1 and 2, the source electrode S and the drain electrode D are arranged apart from each other on both sides of the channel layer 140 in the second direction parallel to the surface of the substrate 105 (e.g., the y-axis direction), and the filling insulating layer 150 may be filled between the source electrode S and the drain electrode D. The channel layer 140 between the source electrode S and the drain electrode D may form a channel of each FeFET.

A memory operation may be performed as a ferroelectric polarization direction is determined according to a gate voltage applied to the gate electrode 120 from each FeFET. Here, in order to perform a nonvolatile memory operation, a gate voltage higher than a coercive voltage—at which ferroelectric polarization switching occurs—may be applied to the gate electrode 120.

In the 3D ferroelectric memory device 100, each FeFET has an MIMFS structure, and as a charge of a certain polarity is applied to the intermediate electrode 120 a memory window (MW) of a FeFET may be increased.

In general, a memory window of a FeFET may be determined by a coercive voltage of a ferroelectric layer. According to some embodiments, the intermediate electrode 120, which is a floating electrode, is provided between the gate insulating layer 160 and the ferroelectric layer 130, and by applying a certain charge to the intermediate electrode 120, a coercive voltage of the ferroelectric layer 130 may be increased, thereby improving the memory window of the FeFET.

For example, in a comparative FeFET, in which an intermediate electrode is not provided, if a coercive voltage of a ferroelectric layer is $V_{CO}$, a memory window may theoretically be about $2 \cdot V_{CO}$. In the FeFET of the MIMFS structure including the intermediate electrode 120, the intermediate electrode 120, to which a certain charge $Q_F$ is applied, is provided between the gate insulating layer 160 and the ferroelectric layer 130, and thus, a coercive voltage $V_C$ of the ferroelectric layer 130 may be $V_{CO}+\mathrm{abs}(Q_F/C_D)$ (where $C_D$ is capacitance of the gate insulating layer 160). Thus, the coercive voltage $V_C$ of the ferroelectric layer 130 in the FeFET may be increased by $\mathrm{abs}(Q_F/C_D)$, compared to a coercive voltage $V_{CO}$ of the ferroelectric layer in the FeFET according to the related art, and the memory window (MW) may be increased by $2 \cdot \mathrm{abs}(Q_F/C_D)$ compared to the comparative memory window ($2 \cdot V_{CO}$). As described above, a memory window may be increased by adding an effect of electric charges stored in the intermediate electrode 120, which is a floating electrode, to the effect of a threshold voltage changing due to ferroelectric polarization.

In the 3D ferroelectric memory device 100, the channel layer 140 is formed in a three-dimensional shape corresponding to the protruding shape of the intermediate electrode 120, and thus, the width W of the channel formed between the source electrode S and the drain electrode D may be increased, and accordingly, the on-current may be increased.

Figure 5:
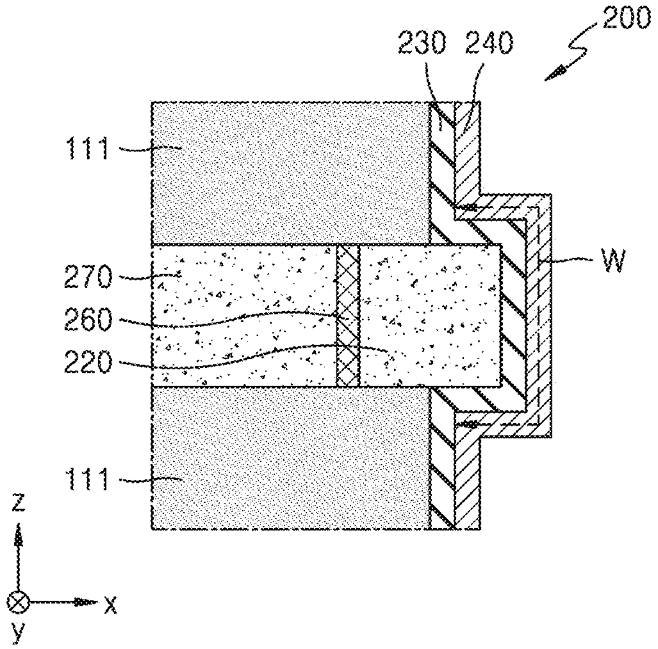
FIG. 5 illustrates a 3D ferroelectric memory device according to at least one embodiment.

FIG. 5 illustrates a 3D ferroelectric memory device 200 according to at least one embodiment. FIG. 5 illustrates a cross-section of one FeFET for convenience, and the same applies to other drawings below. Hereinafter, description will focus on differences from the previous example.

Referring to FIG. 5, a gate electrode 270 may be recessed from the side surfaces of adjacent insulating layers 111 in the first direction parallel to the substrate (105 of FIG. 2) (x-axis direction). The gate electrode 270 is provided with a gate insulating layer 260. The gate insulating layer 260 may be provided on one side surface of the gate electrode 270 that is perpendicular to the substrate 105. In at least some embodiments, a height of the gate insulating layer 260 may be the same as or substantially similar to the distance between adjacent insulating layers 111. A thickness of the gate electrode 270, when viewed in the cross-sectional view, may be the same as the height of the gate insulating layer 260.

An intermediate electrode 220, which is a floating electrode, is provided on the gate insulating layer 260. The intermediate electrodes 220 may be provided to protrude from the side surfaces of adjacent insulating layers 111 in the first direction parallel to the surface of the substrate 105

(x-axis direction). As a charge of a certain polarity is applied to the intermediate electrode 220, a memory window of a FeFET may be increased.

The ferroelectric layer 230 may be provided to contact the surfaces of the insulating layers 111 and the protruding surfaces of the intermediate electrodes 220. The ferroelectric layer 230 may have a curved shape corresponding to the protruding shape of the intermediate electrode 220. The channel layer 240 may be provided to be in contact with the ferroelectric layer 230. The channel layer 240 may have a curved shape corresponding to the ferroelectric layer 230. As the channel layer 240 has a three-dimensional shape corresponding to the protruding shape of the intermediate electrode 220, a width W of a channel formed between the source electrode S and the drain electrode D may be increased, thereby increasing an on-current.

Figure 6:
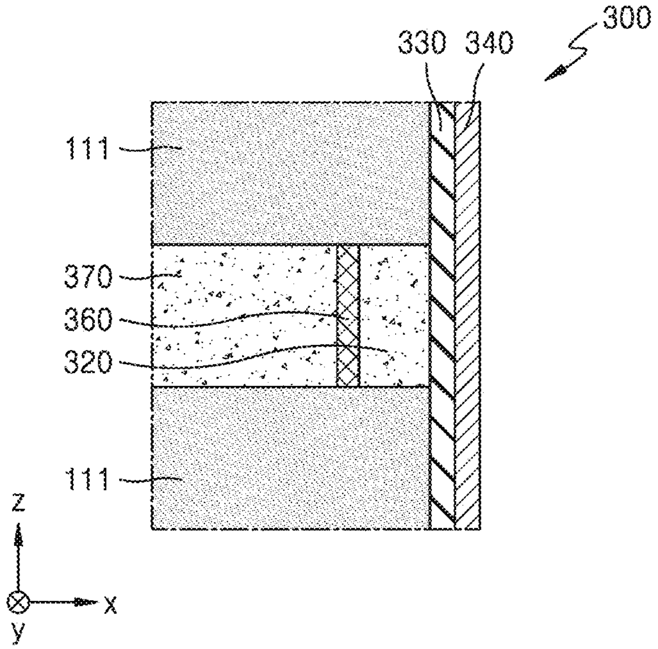
FIG. 6 illustrates a 3D ferroelectric memory device according to at least one embodiment.

FIG. 6 illustrates a 3D ferroelectric memory device 300 according to at least one embodiment. Hereinafter, description will focus on differences from the previous examples.

Referring to FIG. 6, a gate electrode 370 may be recessed from the side surfaces of adjacent insulating layers 111 in the first direction parallel to the substrate 105 (e.g., the x-axis direction). The gate electrode 370 is provided with a gate insulating layer 360. The gate insulating layer 360 may be provided on one side surface of the gate electrode 370 that is perpendicular to the substrate 105.

An intermediate electrode 320, which is a floating electrode, is provided on the gate insulating layer 360. The intermediate electrode 320 may be provided to extend to the side surfaces of adjacent insulating layers 111. As a charge of a certain polarity is applied to the intermediate electrode 320, a memory window of a FeFET may be increased. A ferroelectric layer 330 may be provided to contact the side surfaces of the insulating layers 111 and the side surfaces of the intermediate electrodes 320. The channel layer 340 may be provided to be in contact with the ferroelectric layer 330.

Figure 7:
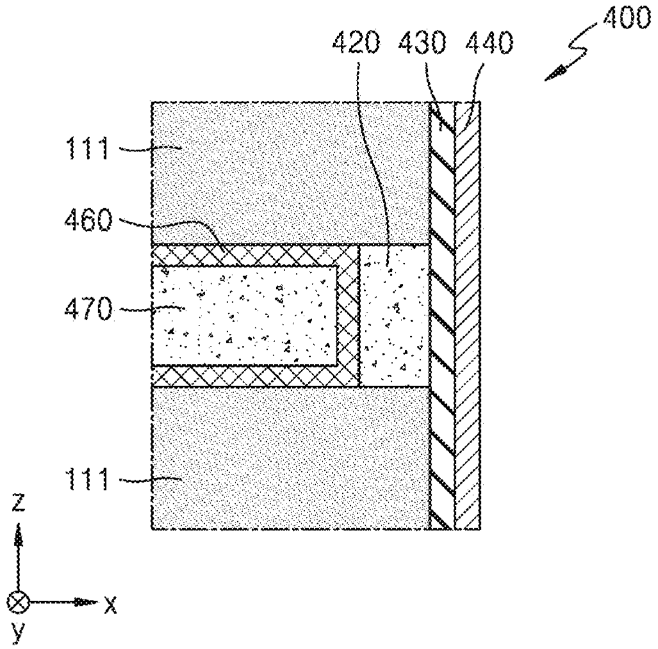
FIG. 7 illustrates a 3D ferroelectric memory device according to at least one embodiment.

FIG. 7 illustrates a 3D ferroelectric memory device 400 according to at least one embodiment. Hereinafter, description will focus on differences from the previous embodiments.

Referring to FIG. 7, a gate electrode 470 may be recessed from the side surfaces of adjacent insulating layers 111 in the first direction parallel to the substrate 105 (x-axis direction). The gate electrode 470 is provided with a gate insulating layer 460. The gate insulating layer 460 may be provided to be in contact with the gate electrode 470. For example, the gate insulating layer 460 may be provided on upper and lower surfaces of the gate electrode 470 parallel to the substrate 105 and on one side surface of the gate electrode 470 perpendicular to the substrate 105. The gate insulating layer 460 may be provided to extend from one side surface of the gate electrode 470 to cover the upper and lower surfaces of the gate electrode 470.

An intermediate electrode 420, which is a floating electrode, is provided on the gate insulating layer 460. The intermediate electrode 420 may be provided to extend to the side surfaces of adjacent insulating layers 111. As a charge of a certain polarity is applied to the intermediate electrode 420, a memory window of a FeFET may be increased. A ferroelectric layer 430 may be provided to contact the side surfaces of the insulating layers 111 and the side surfaces of the intermediate electrodes 420. The channel layer 440 may be provided to be in contact with the ferroelectric layer 430.

FIGS. 8 to 18 are diagrams for describing a method of manufacturing a 3D ferroelectric memory device, according to at least one embodiment. FIGS. 8 to 18 illustrate a method of manufacturing the 3D ferroelectric memory device 100 illustrated in FIG. 2.

Figure 8:
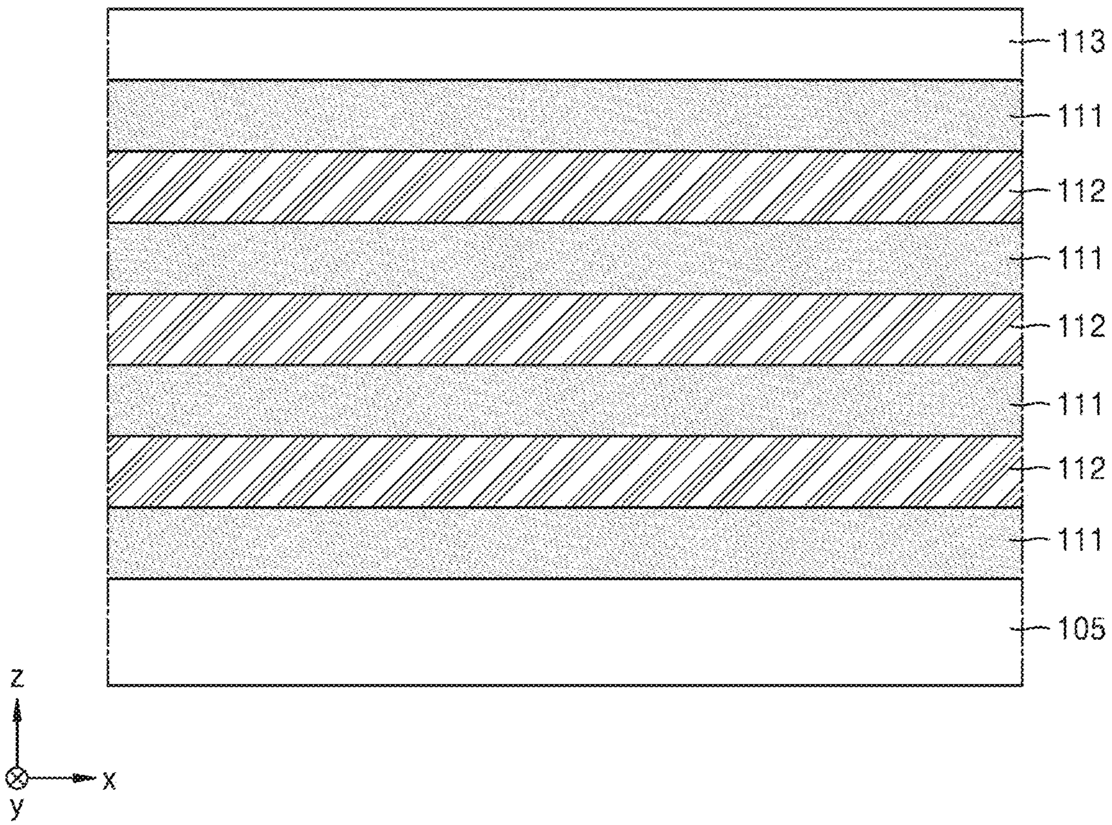
FIGS. 8 to 18 are diagrams for describing a method of manufacturing a 3D ferroelectric memory device, according to at least one embodiment.

Referring to FIG. 8, a plurality of first mold layers 111 and a plurality of second mold layers 112 are alternately stacked in the direction perpendicular to the substrate 105 (z-axis direction), and then a third mold layer 113 is stacked thereon. The substrate 105 may include various materials. For example, the substrate 105 may include a single-crystal silicon substrate, a compound semiconductor substrate, and/or an SOI substrate. However, these are merely examples, and the substrate 105 of various materials may be used. In addition, the substrate 105 may further include an impurity region formed by doping, an electronic element such as a transistor, and/or a periphery circuit for selecting and controlling memory cells for storing data.

The first mold layers 111 correspond to the insulating layers 111 illustrated in FIG. 2 described above, and may include, for example, at least one of SiO, SiOC, and SiON, but are not limited thereto. The first mold layers 111 may have a thickness of, for example, about 7 nm to about 100 nm, but the examples are not limited thereto.

The second mold layers 112 may include a material having an etching selectivity with respect to the first mold layers 111. For example, the second mold layers 112 may include SiN, but is not limited thereto. The third mold layer 113 is provided for patterning the first and second mold layers 111 and 112 and may include a material having an etching selectivity with respect to the first and second mold layers 111 and 112.

Figure 9:
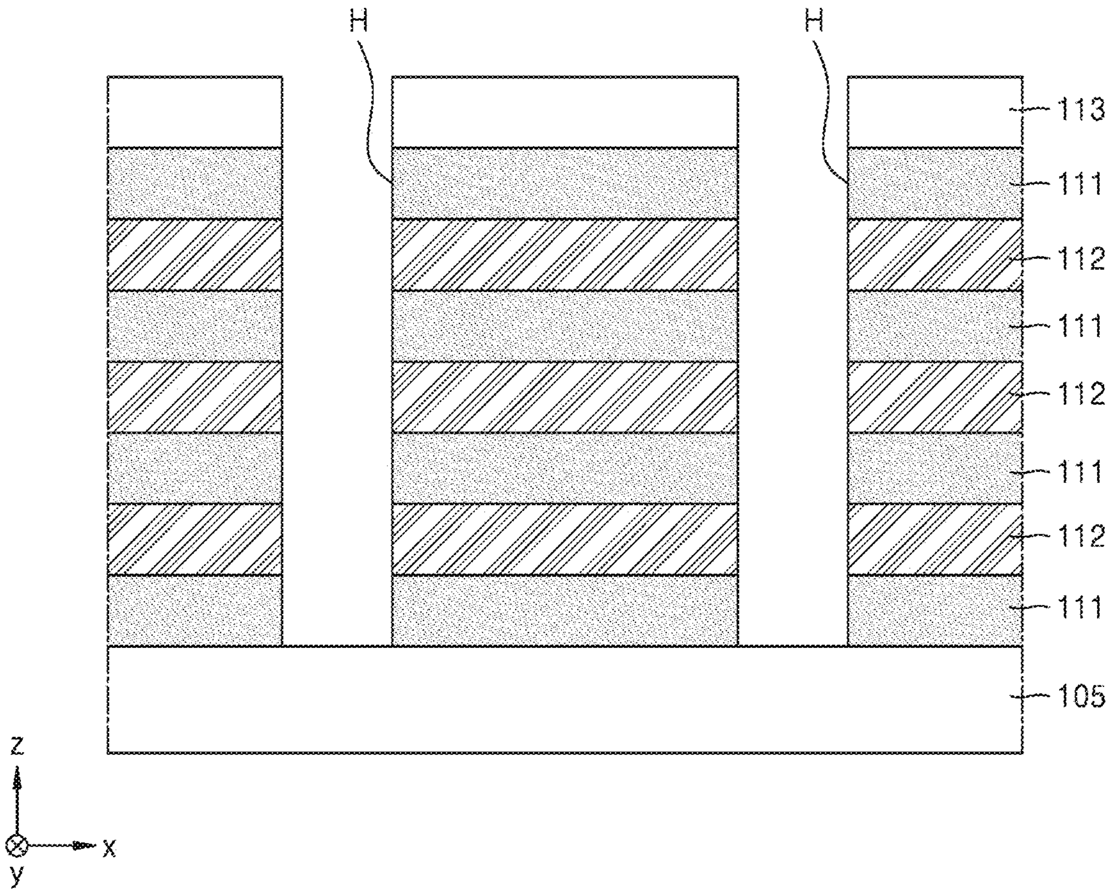

Referring to FIG. 9, after patterning the third mold layer 113, a plurality of through holes H passing through the plurality of first mold layers 111 and the plurality of second mold layers 111 are formed using the patterned third mold layer 113 as an etching mask. In FIG. 9, two through holes H are illustrated as an example. The through holes H may extend in the direction perpendicular to the substrate 105 (z-axis direction). Side surfaces of the first and second mold layers 111 and 112 may be exposed through the through holes H.

Figure 10:
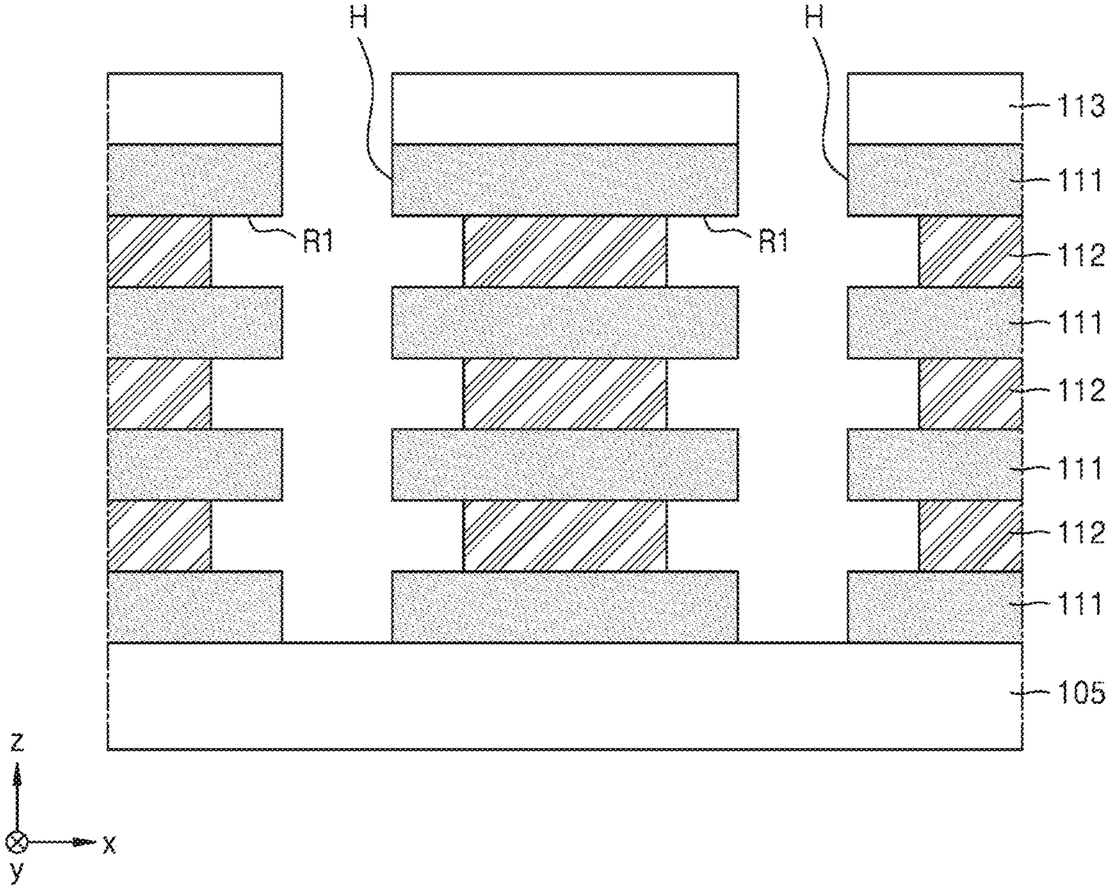

Referring to FIG. 10, first recesses R1 are formed by selectively etching the side surfaces of the second mold layers 112 exposed through the through holes H. Here, each first recess R1 may extend parallel to the surface of the substrate 105 from the side surfaces of the first mold layers 111 to a certain (or otherwise determine) depth.

Figure 11:
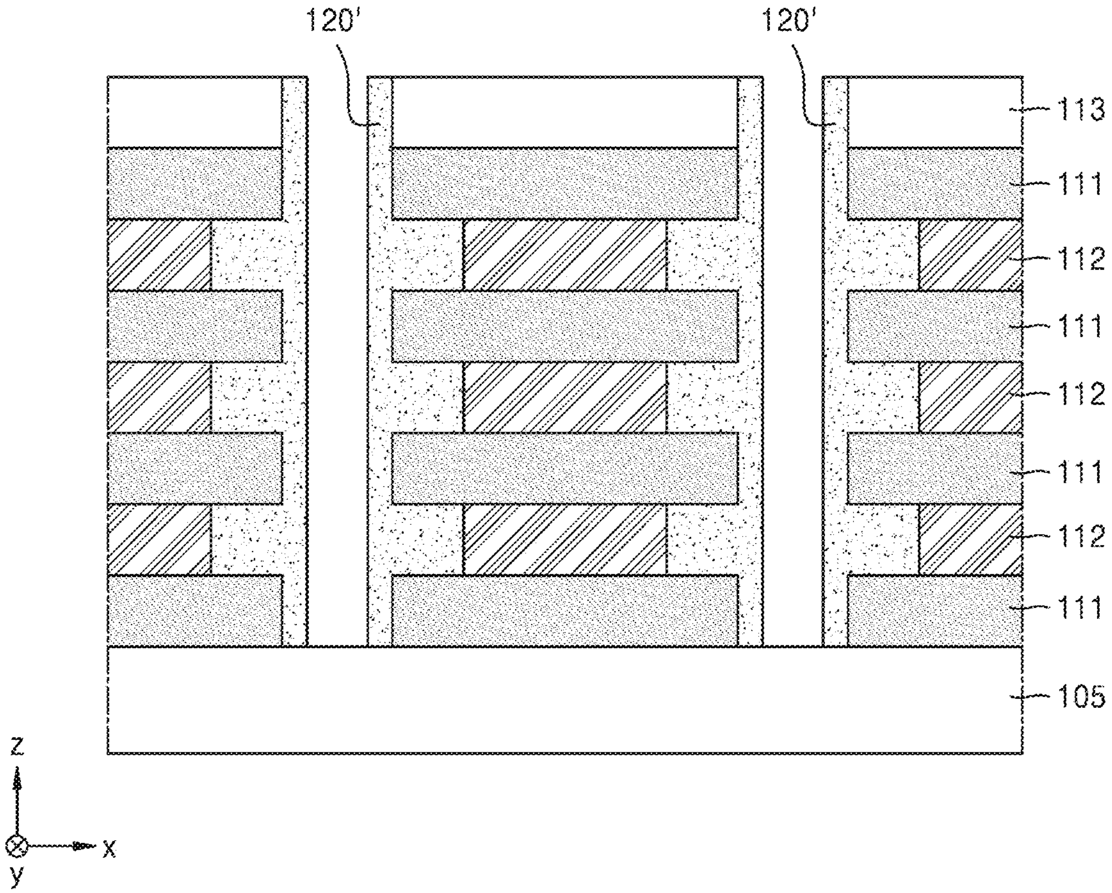
Figure 12:
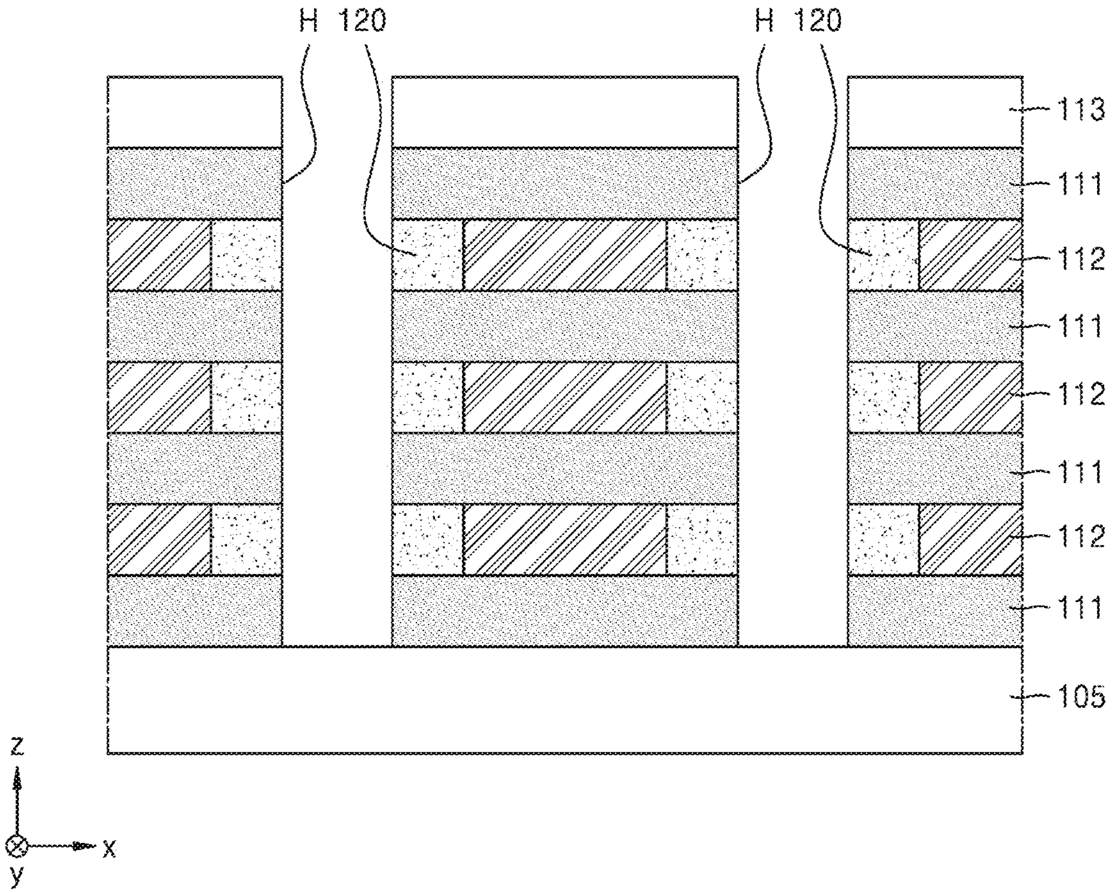

Referring to FIGS. 11 and 12, an intermediate electrode layer 120' is formed to cover the side surfaces of the first mold layers 111 and the first recesses R1. The intermediate electrode layer 120' is then etched until the side surfaces of the first mold layers 111 are exposed, thereby forming the plurality of intermediate electrodes 120. The intermediate electrodes 120 may contact the side surfaces of the second mold layers 112 and may be provided to fill the first recesses R1. The intermediate electrodes 120 may include a conductive material such as metal, metal nitride, metal oxide, polysilicon, and/or the like. For example, the intermediate electrodes 120 may include at least one of W, TiN, TaN, WN, NbN, Mo, Ru, Ir, RuO, IrO, highly doped polysilicon, and/or the like. However, this is only an example, and the intermediate electrodes 120 may include other various conductive materials.

Figure 13:
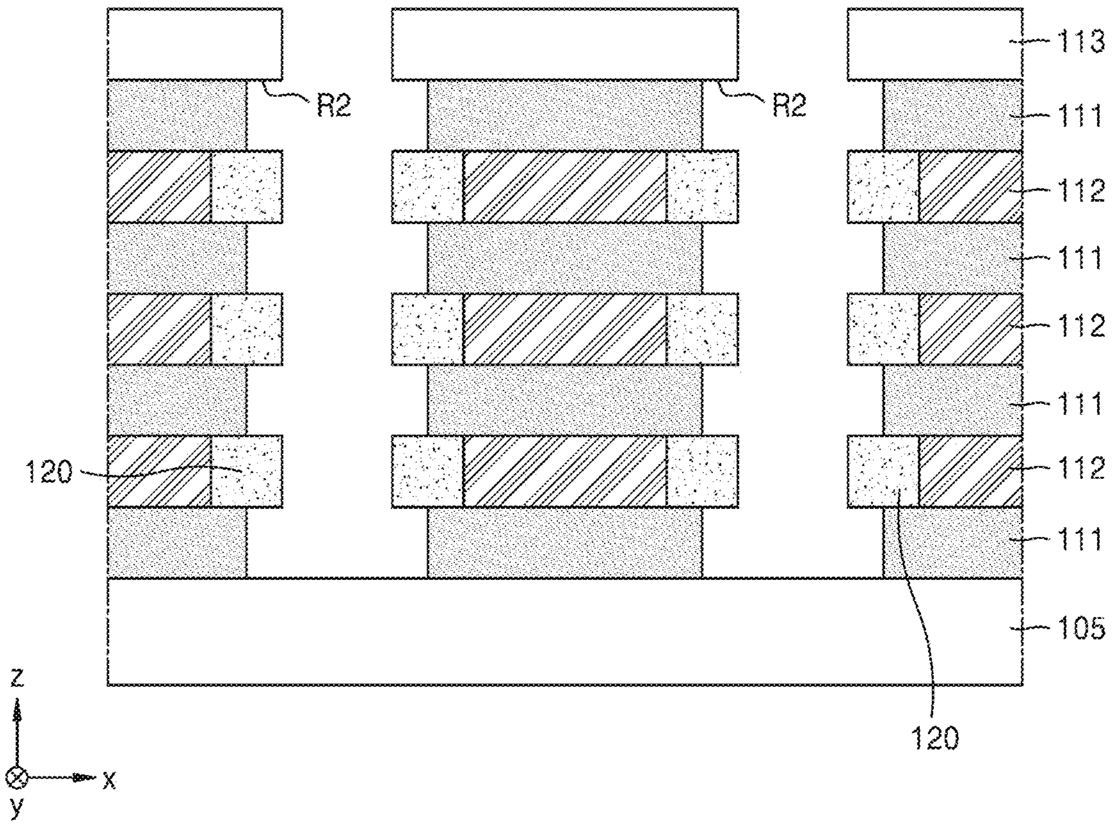

Referring to FIG. 13, second recesses R2 are formed by selectively etching the side surfaces of the first mold layers 111 exposed through the through holes H. Here, each second recess R2 may extend from the side surfaces of the intermediate electrodes 120 and in parallel to the surface of the substrate 105, to a certain (or otherwise determined) depth. The intermediate electrodes 120 may be provided to protrude from the side surfaces of adjacent insulating layers 111 in the first direction parallel to the substrate 105 (e.g., the x-axis direction).

Figure 14:
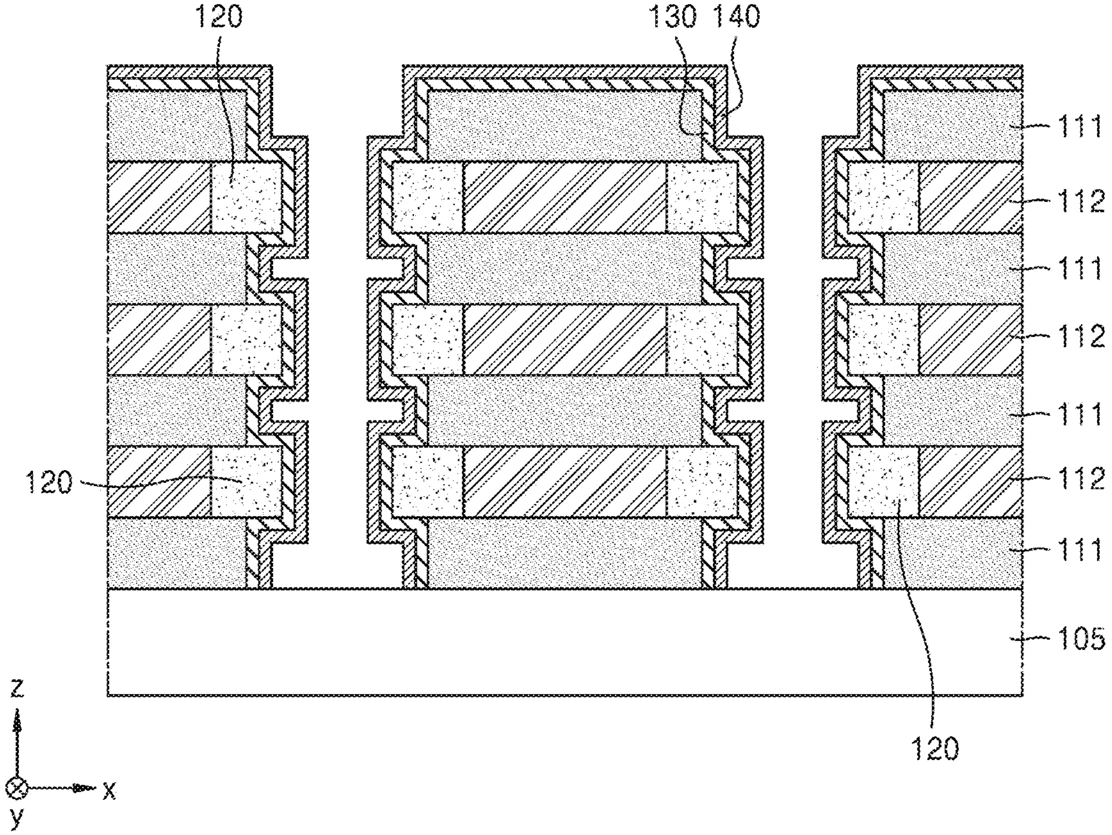

Referring to FIG. 14, after removing the third mold layer 113, the ferroelectric layer 130 and the channel layer 140 may be sequentially deposited on the surfaces of the first mold layers 111 and the intermediate electrodes 120, and then the ferroelectric layer 130 and the channel layer 140 formed on an upper surface of the first mold layer 111 are removed. Accordingly, the ferroelectric layer 130 and the channel layer 140 may be sequentially formed on the side surfaces of the first mold layers 111 and the intermediate electrodes 120, which are in contact with the through holes H, in the first direction parallel to the substrate 105.

The ferroelectric layer 130 may be provided to contact the side surfaces of the insulating layers 111 and the side surfaces of the intermediate electrodes 120. The ferroelectric layer 130 may extend in the direction perpendicular to the surface of the substrate 105 (e.g., the z-axis direction). The ferroelectric layer 130 may have a curved shape due to the intermediate electrodes 120 protruding from the side surfaces of the insulating layers 111 in the first direction parallel to the surface of the substrate 105 (e.g., the x-axis direction).

The ferroelectric layer 130 may include, for example, a ferroelectric fluorite-based material, a ferroelectric nitride-based material, or a ferroelectric perovskite. The ferroelectric nitride-based material may include, for example, AlScN, and the ferroelectric perovskite may include, for example, PZT, $BaTiO_3$, $PbTiO_3$, or the like. However, the disclosure is not limited thereto.

The ferroelectric fluorite-based material may include an oxide of at least one of, for example, Hf, Si, Al, Zr, Y, La, Gd, and Sr. As an example, the ferroelectric layer 130 may include at least one of hafnium oxide (HfO), zirconium oxide (ZrO), and hafnium-zirconium oxide (HfZrO). Hafnium oxide (HfO), zirconium oxide (ZrO), and hafnium-zirconium oxide (HfZrO) constituting the ferroelectric layer 130 may have a non-centrosymmetric crystal structure such as an orthorhombic crystal system. The ferroelectric layer 130 may further include, for example, at least one dopant from among Si, Al, La, Y, Sr, and Gd.

The channel layer 140 may be provided to be in contact with the ferroelectric layer 130. The channel layer 140 may have a curved shape corresponding to the ferroelectric layer 130. The channel layer 130 may extend in the direction perpendicular to the substrate 105 (z-axis direction).

The channel layer 140 may include a semiconductor material. For example, the channel layer 140 may include, a Group IV semiconductor, a Group III-V semiconductor (such as Si, Ge, SiGe, etc.), and/or the like. For example, the channel layer 140 may include, e.g., an oxide semiconductor, a nitride semiconductor, a nitrogen oxide semiconductor, a 2D semiconductor material, quantum dots, an organic semiconductor, and/or the like. Here, the oxide semiconductor may include, for example, InGaZnO, and/or the like; the 2D semiconductor material may include, for example, transition metal dichalcogenide (TMD), graphene, and/or the like; and the quantum dots may include colloidal QDs, a nanocrystal structure, and/or the like. However, these are merely some examples, and the present examples are not limited thereto.

The channel layer 140 may further include a dopant. The dopant may include a p-type dopant and/or an n-type dopant. The p-type dopant may include, for example, a Group III element such as B. Al, Ga, In, and/or the like, and the n-type dopant may include, for example, a Group V element such as P, As, Sb, and/or the like.

Figure 15:
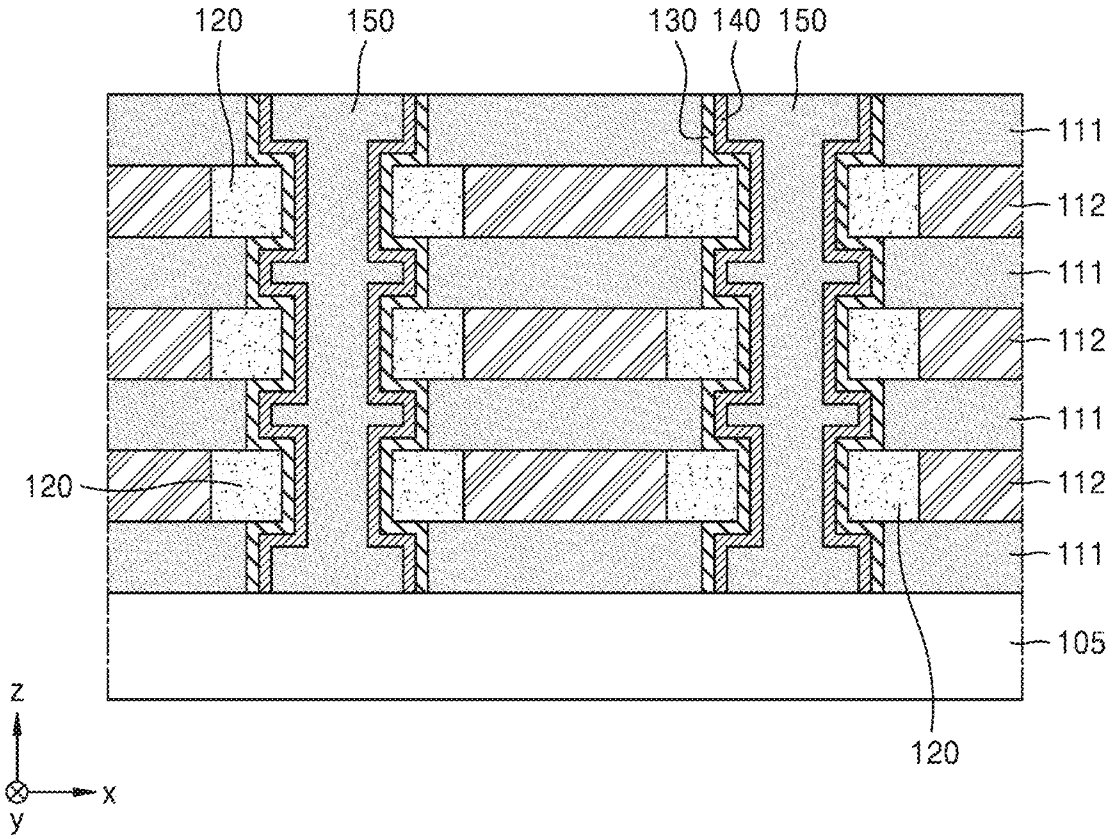
Figure 16:
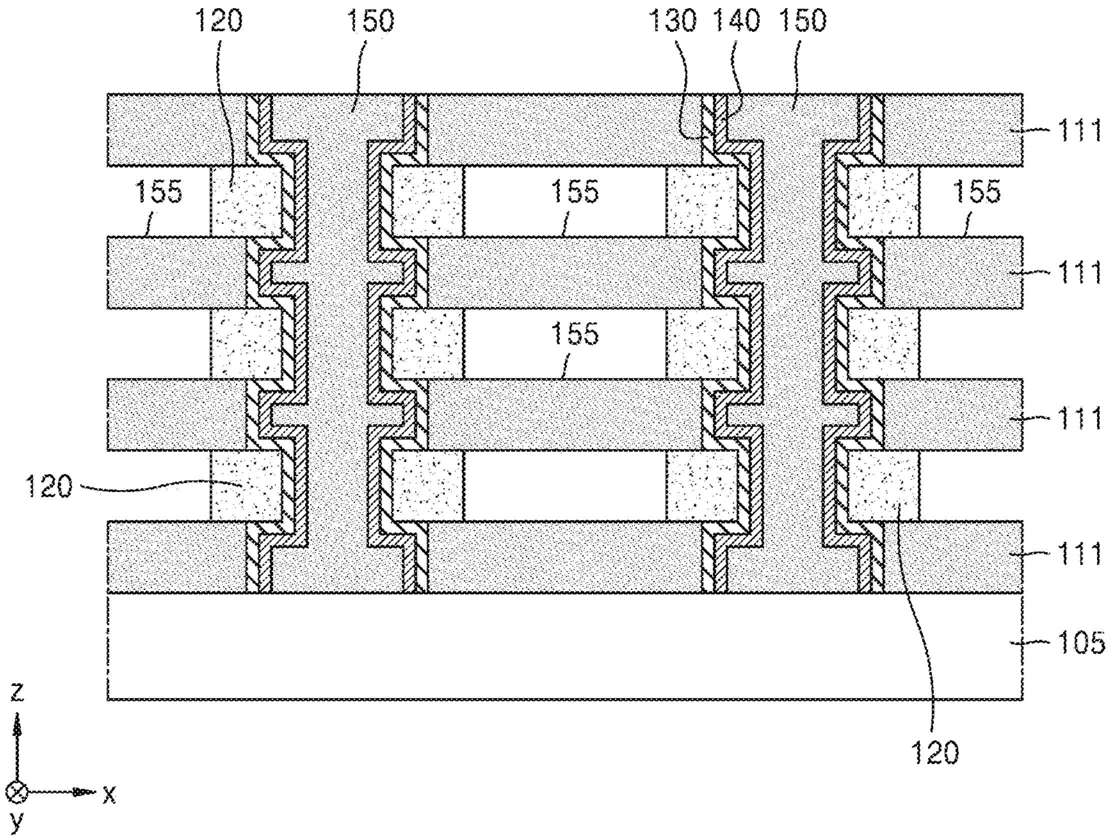

Referring to FIG. 15, a filling insulating layer 150 is formed to fill the remainder of the through holes H. The filling insulating layer 150 may include, for example, various insulating materials such as silicon oxide, silicon nitride, and/or the like. Referring to FIG. 16, an empty space 155 is formed by removing the second mold layers 112 by selective etching. Upper and lower surfaces of the first mold layers 111 and side surfaces of the intermediate electrodes 120 may be exposed through the empty space 155.

Figure 17:
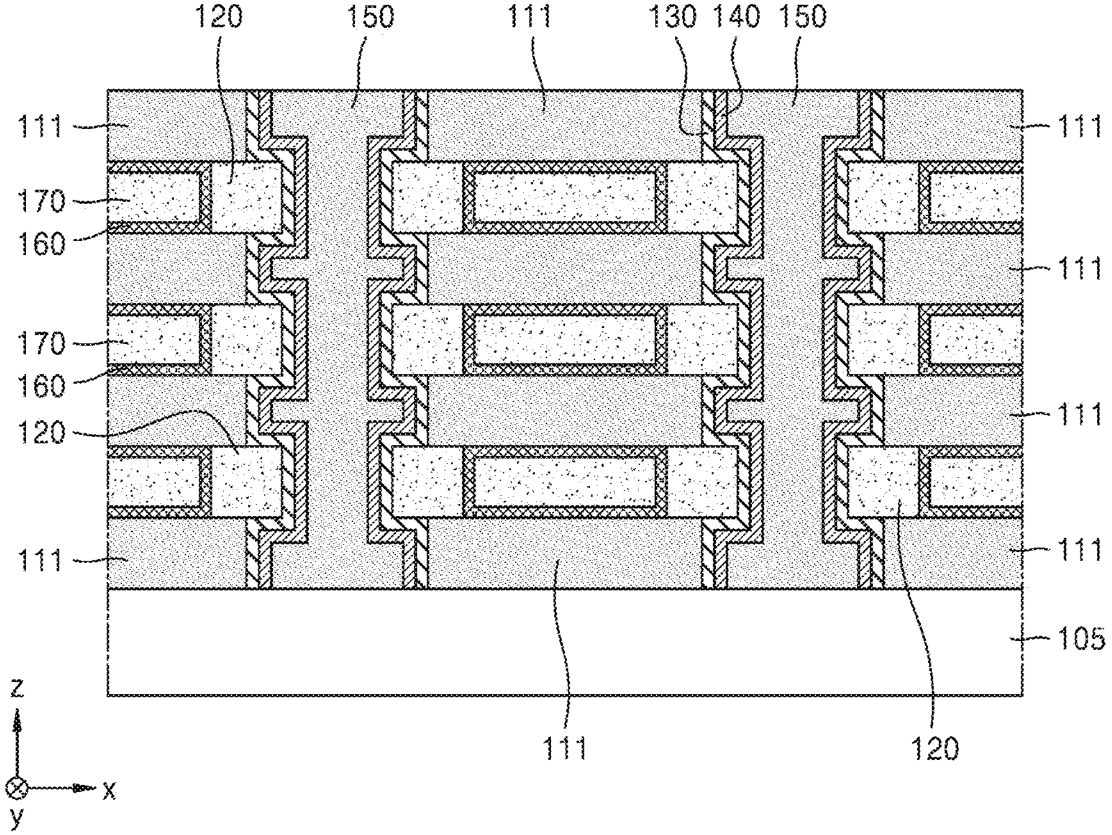

Referring to FIG. 17, the gate insulating layer 160 and the gate electrode 170 are sequentially deposited on an inner wall of the empty space 155. Accordingly, the gate insulating layer 160 may be formed to contact the upper and lower surfaces and side surfaces of the gate electrode 170. The gate insulating layer 130 may include, for example, at least one of SiO, SiN, AlO, HfO, and ZrO, but is not limited thereto.

The gate electrode 170 is formed on an inner surface of the gate insulating layer 160. The gate electrode 170 may include at least one of, for example, W, TiN, TaN, WN, NON, Mo, Ru, Ir, RuO, IrO, polysilicon, and/or the like. However, the examples are not limited thereto.

Figure 18:
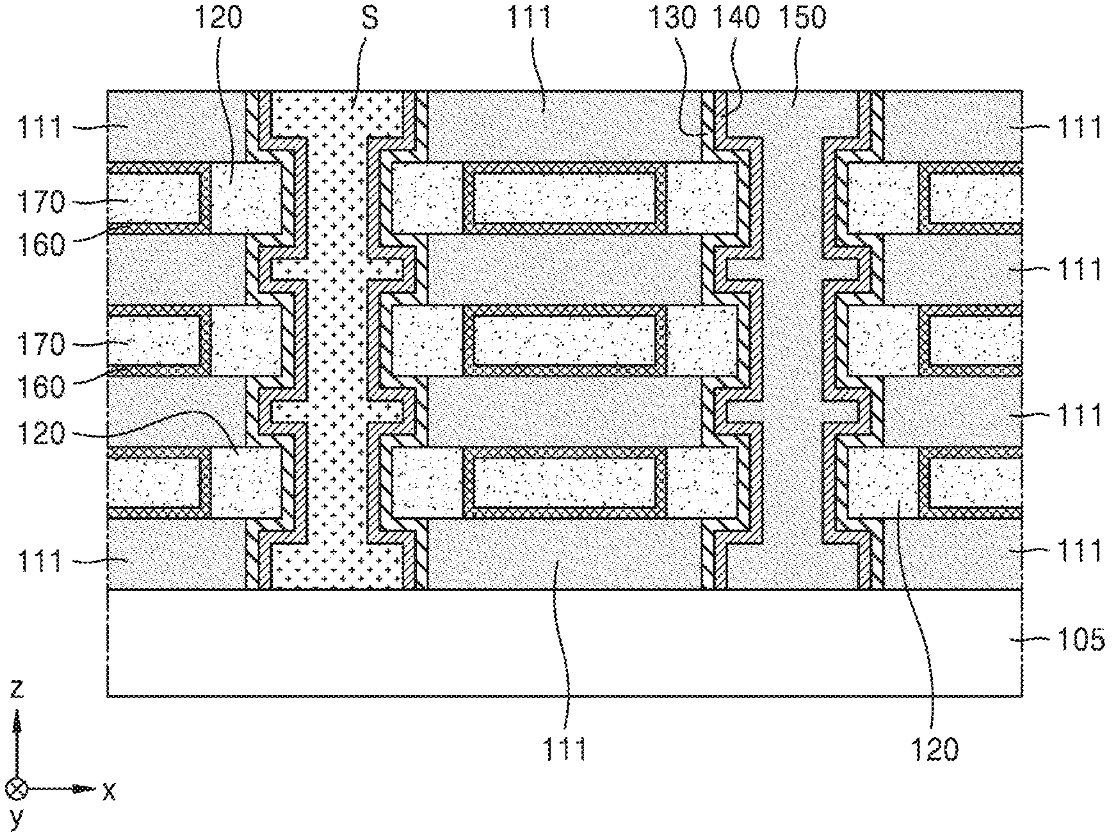

Referring to FIG. 18, one side portion and the other side portion of the filling insulating layer 150 are removed by etching in the direction perpendicular to the surface of the substrate 105, and then a source electrode S and a drain electrode D are formed to complete the 3D ferroelectric memory device 100. The one side portion and the other side portion of the filling insulating layer 150 are spaced apart from each other in the second direction parallel to the surface of the substrate 105 (e.g., the y-axis direction). A plane of the 3D ferroelectric memory device 100 shown in FIG. 18 is shown in FIG. 1. The channel layer 140 extending in the second direction parallel to the surface of the substrate 105 (e.g., y-axis direction) between the source electrode S and the drain electrode D may form a channel of a FeFET.

Figure 19:
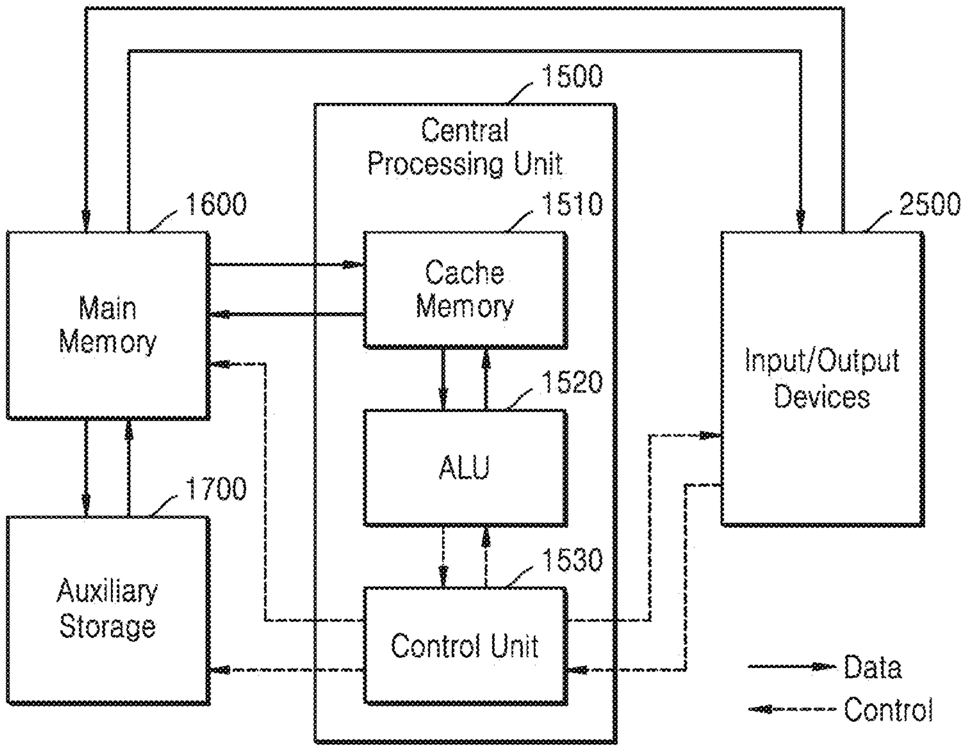
FIG. 19 is a schematic conceptual diagram of a device architecture applicable to an electronic device according to at least one embodiment.

The 3D ferroelectric memory device 100 or 200 described above may be used for data storage in various electronic devices. FIG. 19 is a schematic conceptual diagram of a device architecture applicable to an electronic device according to some example embodiments.

Referring to FIG. 19, a cache memory 1510, an arithmetic logic unit (ALU) 1520, and a control unit 1530 may constitute a central processing unit (CPU) 1500, and the cache memory 1510 may include static random access memory (SRAM). Separately from the CPU 1500, a main memory 1600, an auxiliary storage 1700, and at least one input/output devices 2500 may be provided. The CPU 1500 and/or the main memory 1600 may be connected to at least one input/output device 2500. The input/output device (and/or devices) 2500 may include, for example, an input device (such as a microphone, touch pad, electronic mouse, keyboard, keypad, camera, etc.) and/or an output device (such as a speaker, display, haptic system, etc.). The at least one input/output device 2500 may include, for example, an input device (such as a microphone, touch pad, electronic mouse, keyboard, keypad, camera, etc.) and/or an output device (such as a speaker, display, haptic system, etc.). According to at least some example embodiments, the at least one input/output device 2500 may be provided individually and/or in combination (e.g., a touch screen display).

At least one of the CPU 1500, a main memory 1600, an auxiliary storage 1700, and/or at least one input/output devices 2500 may include at least one of the 3D ferroelectric memory devices described above. For example, the main memory 1600 may include a dynamic random-access memory (DRAM) device, and the auxiliary storage 1700 may include the 3D ferroelectric memory device 100, 200, 300, and/or 400 described above. In some cases, a device architecture may be implemented in a form in which computing unit devices and memory unit devices are adjacent to each other in one chip without any distinction between sub-units.

In the 3D ferroelectric memory device according to the example embodiments, each FeFET has a MIMFS structure, and as a charge of a certain polarity is applied to an intermediate electrode, which is a floating electrode, in addition to the effect of a threshold voltage changing due to ferroelectric polarization, the effect of storing charges in the intermediate electrode may be additionally obtained, thereby increasing a memory window of the FeFET. As the channel layer has a three-dimensional shape corresponding to the protruding shape of the intermediate electrode, a width of a channel formed between a source electrode and a drain electrode may be increased, thereby increasing an on-current.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A three-dimensional (3D) ferroelectric memory device comprising:
- a substrate;
- a plurality of insulating layers stacked on an upper surface of the substrate;
- a plurality of gate electrodes between the plurality of insulating layers;
- a plurality of gate insulating layers on corresponding side surfaces of the plurality of gate electrodes;
- a ferroelectric layer on side surfaces of the plurality of insulating layers;
- a plurality of intermediate electrodes between the plurality of gate insulating layers and the ferroelectric layer; and
- a channel layer on the ferroelectric layer,
- wherein the plurality of gate insulating layers are between the plurality of gate electrodes and the plurality of intermediate electrodes, and
- wherein the ferroelectric layer is between the plurality of intermediate electrodes and the channel layer.

2. The 3D ferroelectric memory device of claim 1, wherein each of the plurality of intermediate electrodes is configured to include a charge of a first polarity.

3. The 3D ferroelectric memory device of claim 1, wherein in a cross-sectional view, the plurality of gate electrodes are stacked in a direction perpendicular to the upper surface of the substrate, and each of the plurality of gate electrodes extends in a direction parallel to the upper surface of the substrate.

4. The 3D ferroelectric memory device of claim 3, wherein each of the plurality of gate electrodes is electrically connected to a word line, and each of the plurality of intermediate electrodes are configured to be a floating electrode.

5. The 3D ferroelectric memory device of claim 1, wherein the plurality of intermediate electrodes extend to protrude from the side surfaces of the plurality of insulating layers in a first direction parallel to the upper surface of the substrate.

6. The 3D ferroelectric memory device of claim 5, wherein the ferroelectric layer and the channel layer each have a protruding shape corresponding to a protruding portion of the plurality of intermediate electrodes.

7. The 3D ferroelectric memory device of claim 5, wherein
- the plurality of gate insulating layers are respectively on an upper surface, a lower surface, and the side surface of corresponding gate electrodes of the plurality of gate electrodes,
- the upper surface and the lower surfaces of the corresponding gate electrodes are parallel to the upper surface of the substrate, and
- the side surface of the corresponding gate electrodes are perpendicular to an upper surface the substrate.

8. The 3D ferroelectric memory device of claim 5, wherein the plurality of gate insulating layers are respectively on one side surface of corresponding gate electrodes of the plurality of gate electrodes.

9. The 3D ferroelectric memory device of claim 5, wherein a source electrode and a drain electrode are respectively on both sides of the channel layer in a second direction that is parallel to the substrate and perpendicular to the first direction.

10. The 3D ferroelectric memory device of claim 9, wherein the source electrode is electrically connected to a corresponding source line, and the drain electrode is electrically connected to a corresponding bit line.

11. The 3D ferroelectric memory device of claim 1, wherein, in a cross-sectional view, the plurality of intermediate electrodes extend towards the side surfaces of the plurality of insulating layers in a first direction parallel to the upper surface the substrate.

12. The 3D ferroelectric memory device of claim 11, wherein
- the plurality of gate insulating layers are respectively on an upper surface, a lower surface, and the side surface of corresponding gate electrodes of the plurality of gate electrodes,
- the upper surface and the lower surfaces of the corresponding gate electrodes are parallel to the upper surface of the substrate, and
- the side surface of the corresponding gate electrodes are perpendicular to the upper surface of the substrate.

13. The 3D ferroelectric memory device of claim 11, wherein the plurality of gate insulating layers are respectively on the side surface of corresponding gate electrodes of the plurality of gate electrodes.

14. The 3D ferroelectric memory device of claim 1, wherein each of the plurality of gate electrodes and each of the plurality of intermediate electrodes independently include at least one of W, TiN, TaN, WN, NbN, Mo, Ru, Ir, RuO, IrO, or polysilicon.

15. The 3D ferroelectric memory device of claim 1, wherein the plurality of insulating layers comprise at least one of SiO, SiOC, SiON, or SiN.

16. The 3D ferroelectric memory device of claim 1, wherein the ferroelectric layer comprise at least one of a ferroelectric fluorite-based material, a ferroelectric nitride-based material, or a ferroelectric perovskite.

17. The 3D ferroelectric memory device of claim 1, wherein the plurality of gate insulating layers comprise at least one of SiO, SiN, AlO, HfO, or ZrO.

18. The 3D ferroelectric memory device of claim 17, wherein the channel layer is provided to correspond with the plurality of gate electrodes.

19. The 3D ferroelectric memory device of claim 18, wherein the channel layer comprises at least one of a Group IV semiconductor, a Group III-V semiconductor, an oxide semiconductor, a nitride semiconductor, a nitrogen oxide semiconductor, a two-dimensional (2D) semiconductor material, quantum dots, or an organic semiconductor.

20. The 3D ferroelectric memory device of claim 1, wherein the channel layer extends in a direction perpendicular to the upper surface of the substrate.

* * * * *